US012113020B2

(12) United States Patent
Smith et al.

(10) Patent No.: US 12,113,020 B2
(45) Date of Patent: Oct. 8, 2024

(54) FORMATION OF METAL VIAS ON METAL LINES

(71) Applicant: Applied Materials, Inc., Santa Clara, CA (US)

(72) Inventors: Ryan Scott Smith, Clifton Park, NY (US); Kai Wu, Palo Alto, CA (US); Nicolas Louis Gabriel Breil, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/184,020

(22) Filed: Feb. 24, 2021

(65) Prior Publication Data

US 2022/0270979 A1   Aug. 25, 2022

(51) Int. Cl.
*H01L 23/532* (2006.01)
*H01L 21/02* (2006.01)
*H01L 21/768* (2006.01)
*H01L 23/522* (2006.01)
*H01L 23/528* (2006.01)

(52) U.S. Cl.
CPC .. *H01L 23/53266* (2013.01); *H01L 21/02183* (2013.01); *H01L 21/02186* (2013.01); *H01L 21/02266* (2013.01); *H01L 21/76831* (2013.01); *H01L 21/76832* (2013.01); *H01L 21/76871* (2013.01); *H01L 21/76877* (2013.01); *H01L 23/5226* (2013.01); *H01L 23/5283* (2013.01); *H01L 23/53238* (2013.01)

(58) Field of Classification Search
CPC ......... H01L 23/53266; H01L 21/76831; H01L 21/76832; H01L 21/76877; H01L 23/5226; H01L 23/53238; H01L 21/0228
See application file for complete search history.

(56) References Cited

U.S. PATENT DOCUMENTS

| 9,704,804 | B1* | 7/2017 | West ................ H01L 23/53223 |
| 2002/0081837 | A1* | 6/2002 | Hong ................ H01L 21/76877 257/E21.585 |
| 2003/0059980 | A1* | 3/2003 | Chen ................ H01L 23/53238 257/E21.171 |
| 2004/0014315 | A1* | 1/2004 | Lai ................ C23C 16/0281 257/E21.585 |
| 2005/0009325 | A1* | 1/2005 | Chung ................ C23C 16/02 438/653 |

(Continued)

*Primary Examiner* — Julia Slutsker
(74) *Attorney, Agent, or Firm* — Kilpatrick Townsend & Stockton LLP

(57) ABSTRACT

Exemplary semiconductor processing methods include forming a via in a semiconductor structure. The via may be defined in part by a bottom surface and a sidewall surface formed in the semiconductor structure around the via. The methods may also include depositing a tantalum nitride (TaN) layer on the bottom surface of the via. In embodiments, the TaN layer may be deposited at a temperature less than or about 200° C. The methods may still further include depositing a titanium nitride (TiN) layer on the TaN layer. In embodiments, the TiN layer may be deposited at a temperature greater than or about 300° C. The methods may additionally include depositing a fill-metal on the TiN layer in the via. In embodiments, the metal may be deposited at a temperature greater than or about 300° C.

20 Claims, 6 Drawing Sheets

(56) References Cited

U.S. PATENT DOCUMENTS

| | | | |
|---|---|---|---|
| 2010/0151672 A1* | 6/2010 | Choi | H01L 21/76846 |
| | | | 257/E21.584 |
| 2014/0264864 A1* | 9/2014 | Weng | H01L 21/76849 |
| | | | 257/751 |
| 2016/0260633 A1* | 9/2016 | Lin | H01L 21/76855 |
| 2019/0221477 A1* | 7/2019 | Amanapu | H01L 23/5226 |

* cited by examiner

FORMATION OF METAL VIAS ON METAL LINES

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Embodiments of the present technology include semiconductor processing methods that further include forming a via in a semiconductor structure. The via may be defined in part by a bottom surface and a sidewall surface formed in the semiconductor structure around the via. The methods may also include depositing a tantalum nitride (TaN) layer on the bottom surface of the via. In embodiments, the TaN layer may be deposited at a temperature less than or about 200° C. The methods may still further include depositing a titanium nitride (TiN) layer on the TaN layer. In embodiments, the TiN layer may be deposited at a temperature greater than or about 300° C. The methods may additionally include depositing a metal on the TiN layer in the via. In embodiments, the metal may be deposited at a temperature greater than or about 300° C.

In additional embodiments, the TaN layer may be deposited by physical vapor deposition (PVD). In further embodiments, the deposited TaN layer may have a greater thickness on the bottom surface of the via than the sidewall surface of the via. In still further embodiments, the TaN layer deposited on the bottom surface of the via may have a thickness less than or about 60 Å. In embodiments, the TiN layer may be deposited by atomic layer deposition (ALD). In further embodiments, the TiN layer may have the same thickness on the bottom and sidewall surfaces of the via. In yet further embodiments, the metal deposited on the TiN layer in the via may be tungsten. In still further embodiments, the metal deposited on the TiN layer in the via may be deposited by chemical vapor deposition (CVD).

Embodiments of the present technology may also include semiconductor processing methods that include forming a via on a metal line in a final metallization layer of a semiconductor structure. The methods may further include forming a TaN layer in the via, and forming a nucleation layer on the TaN layer in the via. The methods may still further include depositing a second metal on the nucleation layer in the via.

In further embodiments, the metal line upon which the via is formed may be made of copper. In yet further embodiments, the TaN layer may be deposited by PVD in the via, and may be deposited at a PVD deposition temperature less than or about 100° C. In still further embodiments, the nucleation layer may include TiN that is deposited by ALD. In additional embodiments, the second metal deposited on the nucleation layer may include one or more metals such as tungsten, molybdenum, cobalt, and/or ruthenium. In still additional embodiments, the second metal may be deposited by chemical vapor deposition at a CVD deposition temperature greater than or about 300° C.

Embodiments of the present technology may yet further include semiconductor structures. In embodiments, the semiconductor structures may include a via formed on a metal line in a metallization layer. The structures may further include a TaN layer formed on a bottom surface of the via. In further embodiments, the TaN layer may be thicker on the bottom surface of the via than a sidewall of the via. In additional embodiments, the TiN layer may be formed on the TaN layer. In still more embodiments, a metal may be formed in the via.

In additional embodiments, the metal line upon which the via is formed may include copper. In further embodiments, the TaN layer on the bottom surface of the via may have a thickness less than or about 60 Å. In still further embodiments, the TiN layer may have the same thickness on the bottom and sidewall surfaces of the via, and may be deposited to a thickness of less than or about 60 Å. In yet further embodiments, the via may have an aspect ratio greater of greater than or about 2:1. In still further embodiments, the metal in the via may include tungsten.

Such technology may provide numerous benefits over conventional systems and techniques. For example, the methods may produce metal-filled via with reduced voids and contaminants caused by the migration of the metal in the adjacent metallization layer into the via. Additionally, the methods may also permit the use of high-temperature deposition techniques to form nucleation layers and metal fills into a via that is adjacent to a metallization layer made from metals that are prone to migrate during high-temperature operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
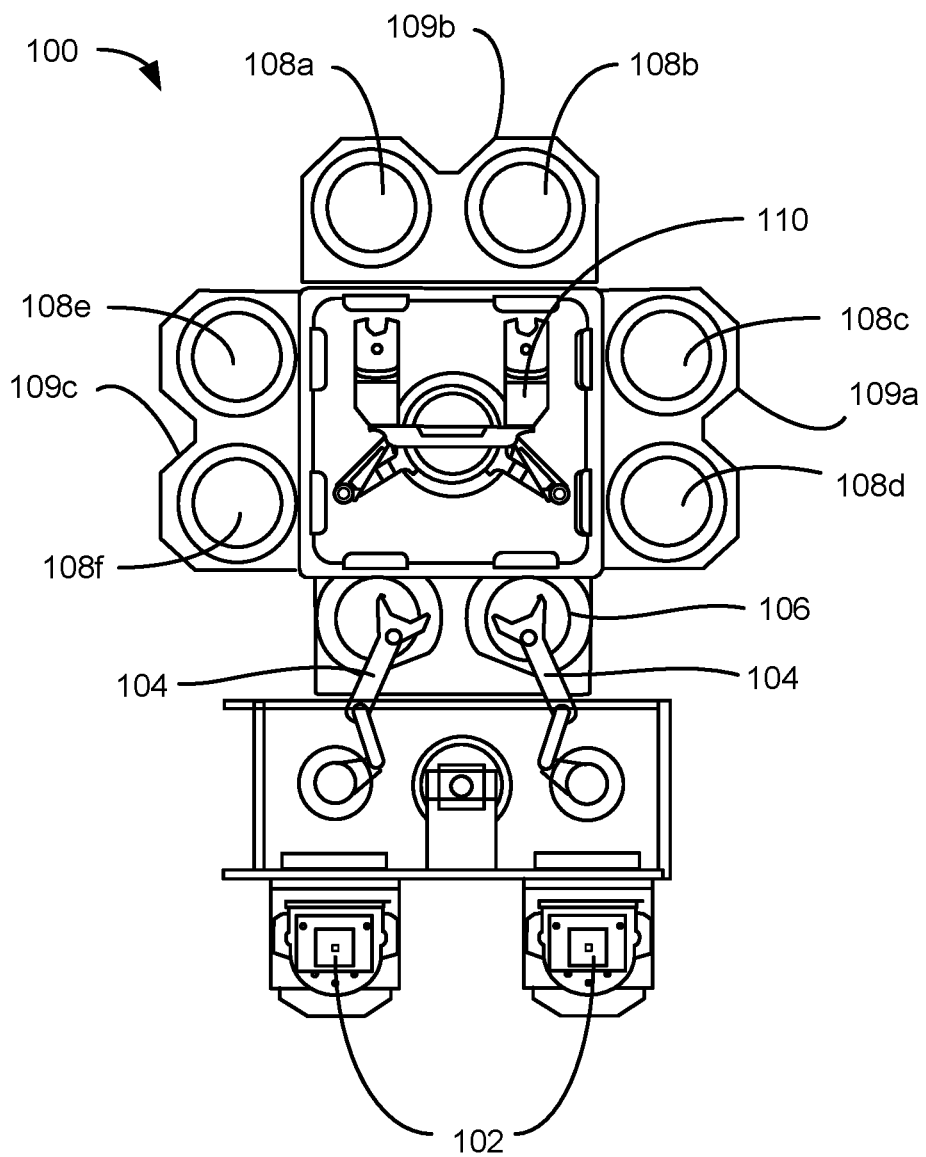
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As more devices produced in semiconductor processing are integrated on a single chip, there is an increased need for efficient techniques to make high-conductivity metal-filled vias to connect devices in different layers of a semiconductor structure. There is also a need to make these vias at smaller scale to accommodate the smaller sizes and increased device density on the semiconductor chip.

In many instances, conventional methods of forming and filling vias between metal layers of a semiconductor structure (or between the device layer and first metal layer) are not suited to making these inter-device connections. Conventional via formation may start by pattern etching the via into one or more layers of dielectric material that are positioned on a copper metal layer that may form a metal line in a metallization layer of the semiconductor structure. The bottom surface of the via may be defined by the exposed surface of the copper layer after the patterned etching of the dielectric material. A composite barrier layer of tantalum nitride (TaN) and titanium nitride (TiN) may be deposited on the interior surfaces of the via, including the bottom surface defined by the exposed copper layer. The TaN/TiN layer deposition is typically done by chemical vapor deposition (CVD) and/or atomic layer deposition (ALD) of tantalum and titanium precursors at high temperature (e.g., greater than 300° C.). At these deposition temperatures, the copper near the surface of the exposed metal layer becomes volatile enough to migrate into the forming barrier layer. The copper-infiltrated TaN/TiN barrier layer can contaminate the via with copper as well as become more porous to the migration of additional copper from the adjacent metal layer.

In many instances, the via defined by the contaminated and damaged barrier layer is filled with a conductive metal such as tungsten. The fill is done by depositing the metal into the barrier-layer-lined via by chemical vapor deposition of metal precursors. When the metal is tungsten, the deposition of the tungsten precursors is typically performed at temperatures greater than 300° C., which encourages additional adverse reactions of the copper with the tungsten and the formation of voids at the interface of the metal-filled via and adjacent copper metal layer. The voids and contaminants in the tungsten metal can significantly reduce the electrical conductivity of the metal-filled via, which can increase power consumption and reduce signal speeds between the interconnected devices of the semiconductor substrate. For conventional metal fills, the voids may represent a volume percentage of the metal-filled vias that is greater than or about 1 vol. %, greater than or about 2 vol %, greater than or about 3 vol. %, greater than or about 4 vol. %, greater than or about 5 vol %, greater than or about 6 vol %, greater than or about 7 vol %, greater than or about 8 vol %, greater than or about 9 vol %, greater than or about 10 vol %, or more.

Embodiments of the present technology address the problem of metal migration from metal layers, such as copper, into a via's metal fill material, such as tungsten. In embodiments, a barrier material that can stop the metal migration may be deposited at low temperature on the surfaces of the via that are defined by exposed portions of the metal layer. The low-temperature deposition keeps the adjacent surface of the metal layer from heating to the point that significant metal migration occurs. In further embodiments, the barrier material may be deposited isotropically to favor deposition at the bottom surface over a sidewall surface of the via. An isotropic deposition of the barrier material focuses barrier protection at the interface of the metal layer and the via, while providing more volume for the metal-fill material to be placed against via's sidewall surface. The larger amounts of metal-fill material relative to barrier material in the via can increase the electrical conductivity the via's interconnect between devices in the semiconductor structure.

In additional embodiments of the present technology, high-temperature depositions may be performed after the low-temperature deposition of the barrier material on the surfaces of the via defined by exposed portions of an underlying metal layer. The presence of the low-temperature-deposited barrier material significantly reduces, or eliminates, the migration of metal from the metal layer into the via during these higher-temperature depositions. In embodiments, these higher-temperature depositions may include the deposition of additional barrier materials, the deposition of a nucleation layer for the metal-fill deposition, and the metal-fill deposition itself.

Embodiments of the present technology may also permit the use of higher-temperature deposition operations more typically used in front-end-of-line (FEOL) and middle-of-line (MOL) operations in back-end-of-line (BEOL) operations where thermal budgets are generally lower. These higher-temperature deposition operations may include CVD and ALD operations conducted at deposition temperatures greater than or about 300° C. In embodiments, these higher-temperature operations may be used to form metal-filled vias during or after the BEOL formation of the final metallization layer of first device and the FEOL layers of a second device in a semiconductor structure having multiple integrated devices.

In further embodiments, the metal-filled vias formed in the first device using the present technology may be more thermally stable during the high-temperature FEOL operations used to form the initial layers of a second device on the same semiconductor substrate. In yet further embodiments, the metal-filled via in contact with the final metallization layer of the first device, which is the metallization layer closest to the initial, FEOL-formed layers of the second device, may experience little or no metal contamination from the final metallization layer during the high-temperature FEOL operations.

Although the remaining disclosure will routinely identify specific structures, such as metal-filled vias between devices in a semiconductor structure, for which the present structures and methods may be employed, it will be readily understood that the systems and methods are equally applicable to any number of structures and devices that may benefit from the formation of a via, trench, recess, or other feature on a semiconductor substrate. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
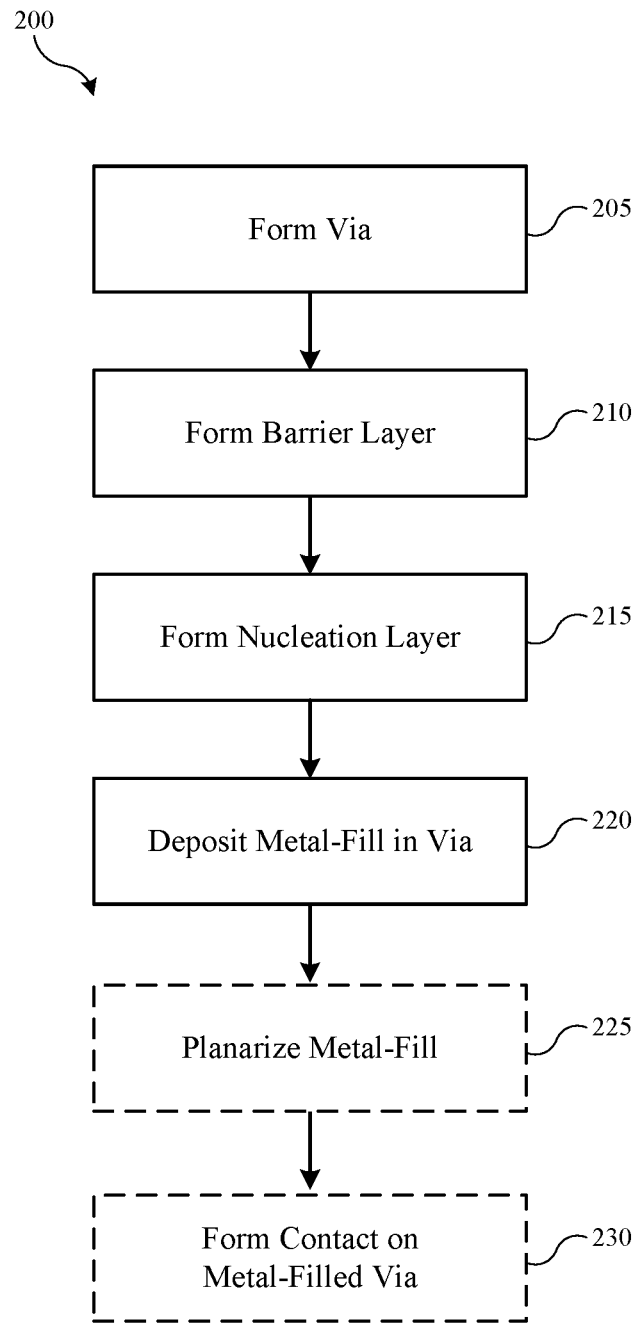
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor device according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3F, the illustrations of which will be described in conjunction with the operations of method 200. It is to be understood that FIGS. 3A-3F illustrate only partial schematic views with limited details, and in some embodiments a substrate may contain any number of semiconductor sections having aspects as illustrated in the figures, as well as alternative structural aspects that may still benefit from any of the aspects of the present technology.

Method 200 may involve optional operations to develop the semiconductor structure to a particular fabrication operation. Although in some embodiments method 200 may be performed on a base structure, in some embodiments the method may be performed subsequent to other material formation. The semiconductor structure may represent a device after front-end, back-end, or other processing has been completed. For example, a substrate may be a planar material, or may be a structured device, which may include multiple materials configured as posts, trenches, or other structures as would be understood are similarly encompassed by the present technology. The substrate may include any number of conductive and/or dielectric materials including metals, including transition metals, post-transition metals, metalloids, oxides, nitrides, and carbides of any of these materials, as well as any other materials that may be incorporated within a structure. In some embodiments, the substrate may be or include silicon, which may be doped by any number of materials, as well as silicon-containing or gallium-containing materials.

Figure 3A:
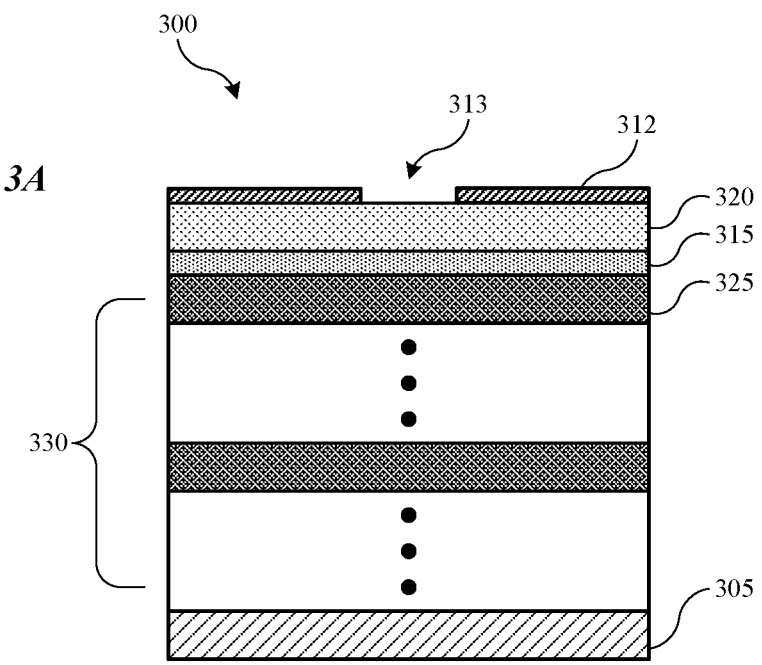
FIGS. 3A-3F show cross-sectional views of substrates being processed according to some embodiments of the present technology.
Figure 3B:
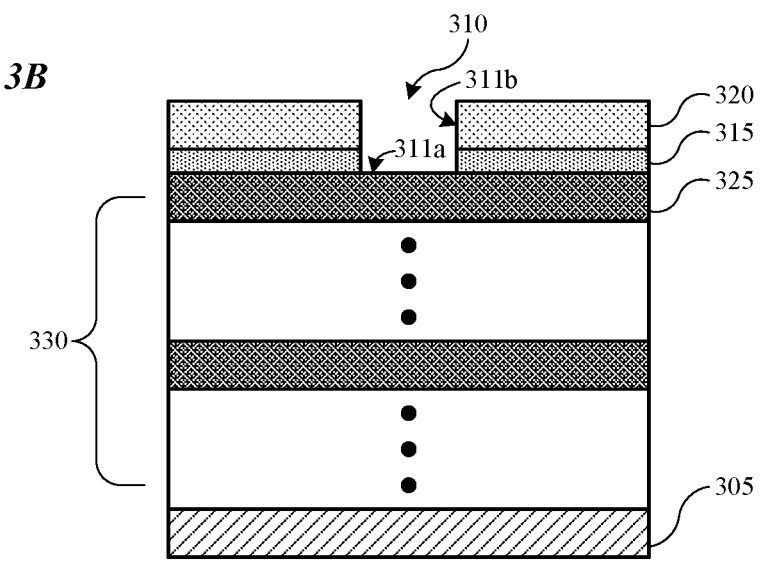

Method 200 may include an operation 205 to form a via 310 in a semiconductor structure 300 that may include substrate 305 as shown in FIGS. 3A-B. In embodiments, via formation may include etching the via 310 into one or more layers of material 315 and 320 until exposing a surface of a metal line 325 in a stack of metallization layers 330. In further embodiments, the one or more materials layers 315 and 320 may be made from dielectric materials. For example, embodiments of material layer 315 may include a silicon-oxygen-and-carbon-containing, low-κ dielectric material. The layer 315 may have a thickness of greater than or about 100 Å, greater than or about 200 Å, greater than or about 300 Å, greater than or about 400 Å, greater than or about 500 Å, or more. In additional embodiments material layer 320 may include a silicon-and-oxygen containing material such as silicon oxide. In still further embodiments, the material layer 320 may have a thickness greater than or about 200 Å, greater than or about 400 Å, greater than or about 600 Å, greater than or about 800 Å, or more.

In embodiments, operation 205 to form the via 310 in the semiconductor structure 300 may include a patterned etching of the material layers 315 and 320. In further embodiments, the patterned etching may include the deposition and patterning of a hard mask 312 that includes opening 313 that exposes the portion of material layer 315 as shown in FIG. 3A. In still further embodiments, the openings may be round, and may have a diameter greater than or about 50 Å, greater than or about 100 Å, greater than or about 200 Å, greater than or about 300 Å, greater than or about 400 Å, greater than or about 500 Å, greater than or about 600 Å, greater than or about 700 Å, greater than or about 800 Å, greater than or about 900 Å, greater than or about 1000 Å, or more.

In further embodiments, etch operation 205 may etch through the material layers 315 and 320 until stopping at an exposed surface of the underlying metal line 325 as shown in FIG. 3B. In embodiments, this opening may define the bottom surface 311a of the via 310, while the opposite-facing opening formed in the top of material layer 315 may define the open-ended top of the via. In still further embodiments, the at least one surface formed between the bottom surface 311a and the top of the via 310 may define a sidewall surface 311b of the via 310. In still further embodiments, the via 310 may have a cylindrical shape that is characterized by a single round sidewall formed between the open-ended top and bottom surface 311a of the via. In yet further embodiments, the via may be tapered between the top and bottom surface 311a such that the open-ended top has a larger surface area than the bottom surface. In embodiments, the surface area ratio between the open-ended top and bottom surface 311a of via 310 may be greater than or about 1:1, greater than or about 1.1:1, greater than or about 1.25:1, greater than or about 1.5:1, greater than or about 1.75:1, greater than or about 2:1, greater than or about 2.25:1, greater than or about 2.5:1, greater than or about 2.75:1, greater than or about 3:1, or more.

In still further embodiments, the via 310 may have a depth extending though the material layers 315 and 320 that is greater than the width (or diameter) of the top and bottom surface 311a. In embodiments, the via 310 may be characterized by an aspect ratio of (i.e., the depth to width ratio) of greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

Figure 3C:
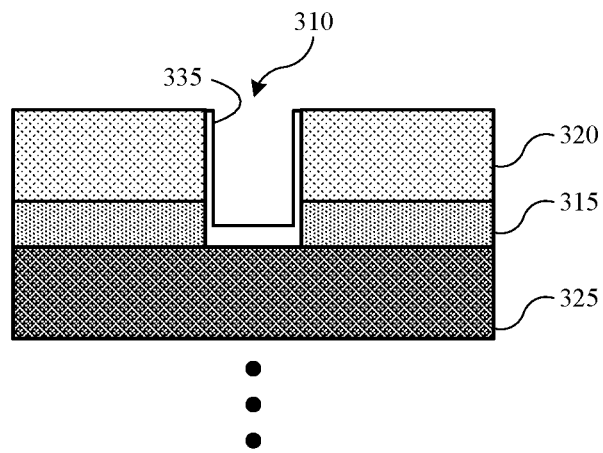

Method 200 may further include an operation 210 to form a barrier layer 335 in the via 310. As shown in FIG. 3C, the barrier layer 335 may be formed directly on the exposed portion of the metal line 325 that characterizes the bottom surface of the via 310. In further embodiments, the barrier layer 335 may prevent the migration of metal from the metal line 325 into the via 310 where it can react with metal fill materials in the via 310 and create contamination and voids in the metal-filled via. In embodiments, the metal line 325 may be made of copper, and the barrier layer 335 may be made of a material that prevents the migration of copper, such as a tantalum nitride.

In still further embodiments, operation 210 to form the barrier layer 335 may include forming the barrier layer with a low-temperature deposition. A low-temperature deposition prevents the metal line 325 from heating to a temperature where significant migration of metal from the metal line occurs. In embodiments, the barrier layer 335 may be deposited in the via 310 at a deposition temperature of less than or about 200° C., less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., or less.

In yet further embodiments, operation 210 may include forming the barrier layer 335 with an anisotropic deposition that favors the grown of the layer on the bottom side of the via 310 compared to the at least one sidewall of the via. In embodiments, an anisotropic deposition focuses the growth of the barrier layer 335 at the interface with the exposed surface of the metal line 325 where metal migration from the metal line has the greatest flux. An anisotropic deposition that favors bottom-side growth in the via 310 also leaves more volume across the width of the via for a metal-fill material since less width is occupied by the barrier layer 335 deposited along the via's sidewalls. The additional metal-fill material that would otherwise be displaced along the via's sidewall by an isotropically-grown barrier layer may increase the electrical conductivity of the metal-filled via. In embodiments, this effect may be increasingly pronounced in smaller, high-aspect-ratio vias, where the surface area of the sidewall surface increases relative to the bottom surface of the via. In embodiments, the barrier layer 335 may be characterized by a thickness at the bottom surface of the via 310 that is greater than a thickness along at least one sidewall of the via. In further embodiments, the barrier layer 335 may be characterized by a bottom surface to sidewall surface thickness ration that is greater than or about 1.1:1, greater than or about 1.5:1, greater than or about 2:1, greater than or about 2:1, greater than or about 2:1, greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more. In still further embodiments, the barrier layer 335 may be characterized by a thickness at the bottom surface of greater than or about 30 Å, greater that or about 40 Å, greater that or about 50 Å, greater that or about 60 Å, greater that or about 70 Å, greater that or about 80 Å, greater that or about 90 Å, greater that or about 100 Å, or more.

In still further embodiments, operation 210 may include forming the barrier layer 335 by low-temperature, isotropic, physical vapor deposition (PVD). In embodiments, the PVD deposition may include positioning a sputtering target that includes a metal such as tantalum over the substrate 305 and firing a sputtering gas at the sputtering target. In additional embodiments, the sputtering gas causes reactive tantalum to emit from the sputtering target and react with nitrogen in the sputtering atmosphere to make tantalum nitride that can isotropically-deposit in and around the via 310. In still additional embodiments, the sputtered TaN deposits in greater amounts at the bottom surface of the via 310 than down the at least one sidewall surface of the via. In yet further embodiments, a etch or planarization operation may be performed to remove some or all of the excess TaN deposited on top of material layer 315.

Figure 3D:
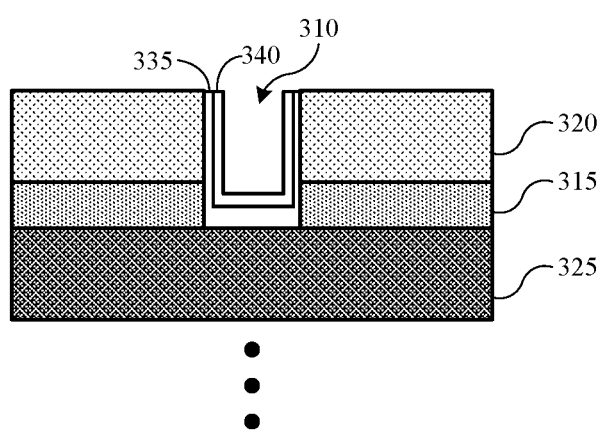

Method 200 may still further include operation 215 to form nucleation layer 340 on barrier layer 335 in the via 310 as shown in FIG. 3D. In embodiments, the operation 215 to form the nucleation layer 340 may be done at a higher temperature than operation 210 to form the barrier layer 335. This may be due to the nucleation layer 340 being deposited by an atomic layer deposition (ALD) or chemical vapor deposition (CVD) technique that operates more efficiently at higher temperatures than the low-temperature deposition of the barrier layer 335. Additionally, because the barrier layer may be fully in place, migration of metal or other damage may be prevented from the higher-temperature operation. In embodiments, the nucleation layer 340 may be deposited at a deposition temperature of greater than or about 200° C., greater than or about 225° C., greater than or about 250° C., greater than or about 275° C., greater than or about 300° C., greater than or about 325° C., greater than or about 350° C., greater than or about 375° C., greater than or about 400° C., or more.

In additional embodiments, operation 215 may include an isotropic deposition that forms a nucleation layer 340 of approximately the same thickness on the bottom and sidewall surfaces of the via 310. In contrast to the barrier layer 335 that focuses on preventing migration of metal at the interface of the via 310 and the metal line 325, the nucleation layer 340 promotes the growth of a metal-fill material in the via from both the bottom and sidewall surfaces. On the other hand, the thickness of the nucleation layer 340 may be equal to or less than the thickness of the barrier layer 335 to reduce the volume of both layers displacing the metal-fill material within the via 310. In embodiments, the nucleation layer 340 may have a thickness of less than or about 60 Å, less than or about 50 Å, less than or about 40 Å, less than or about 30 Å, less than or about 20 Å, less than or about 10 Å, or less.

In embodiments, the nucleation layer 340 may be made of titanium nitride (TiN) deposited by ALD. In further embodiments, the ALD deposition temperature may be greater than or about 300° C., greater than or about 325° C., greater than or about 350° C., greater than or about 375° C., greater than or about 400° C., or more. In still further embodiments, the ALD-deposited TiN nucleation layer 340 may be deposited from one or more titanium precursors such at titanium tetrachloride ($TiCl_4$) and/or tetrakis(dimethylamino)titanium (TDMAT), and one or more nitrogen precursors such as ammonia ($NH_3$). In embodiments, the ALD-deposition may also include a carrier gas such as He and/or $N_2$. In some instances, the $N_2$ gas may also act as a reactive nitrogen precursor. In embodiments, the titanium precursors may be supplied to a deposition region of a deposition chamber configured for ALD and holding the substrate 305. In additional embodiments, the titanium precursor and nitrogen-containing precursor may be supplied sequentially to the deposition region. In further embodiments, the titanium precursor may be supplied first followed by a purge of the deposition region with the carrier gas and then the introduction of the reactive nitrogen-containing precursor to the deposition region.

Figure 3E:
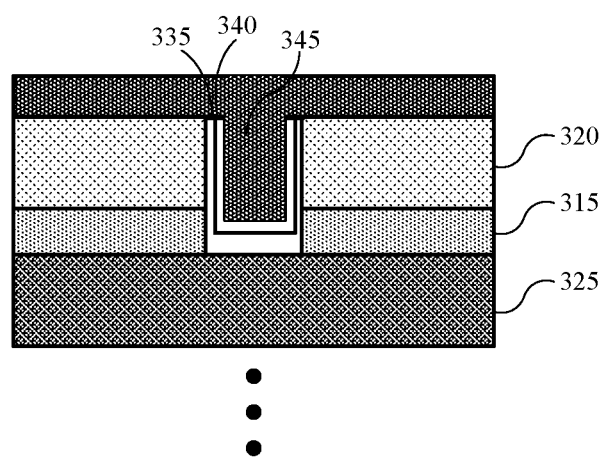

Method 200 may yet further include operation 220 to deposit a metal-fill material 345 on the nucleation layer 340 in the via 310 as shown in FIG. 3E. In embodiments, the operation 220 to deposit the metal-fill material 345 may be done at the same or higher temperature than operation 215 to form the nucleation layer 340. In further embodiments, the metal-fill material 345 may be deposited at a higher deposition temperature than the deposition temperature used to form the barrier layer 335. In embodiments, the metal-fill material 345 may be deposited at a deposition temperature greater than or about 200° C., greater than or about 225° C., greater than or about 250° C., greater than or about 275° C., greater than or about 300° C., greater than or about 325° C., greater than or about 350° C., greater than or about 375° C., greater than or about 400° C., or more. The higher-temperature CVD depositions of the metal-fill material 345 may be more efficient (e.g., higher deposition rates, lower defect rates) than lower-temperature depositions performed at deposition temperatures less than 200° C.

In embodiments, the metal-fill material 345 may be one or more metals such as tungsten, molybdenum, cobalt, or ruthenium. In additional examples, the metal-fill material 345 may be tungsten deposited by the chemical vapor deposition of a tungsten containing precursor.

In still additional examples, the tungsten CVD deposition may be a thermal deposition of one or more tungsten precursors at a deposition temperature greater than or about 300° C., greater than or about 310° C., greater than or about 320° C., greater than or about 330° C., greater than or about 340° C., greater than or about 350° C., greater than or about 360° C., greater than or about 370° C., greater than or about 380° C., greater than or about 390° C., greater than or about 400° C., or more.

In further examples, the tungsten precursor may be one or more of tungsten hexafluoride ($WF_6$), tungsten hexacarbonyl ($W(CO)_6$), bis(cyclopentadienyl) tungsten(IV) dihydride ($C_{10}H_{12}W$), tetracarbonyl(1,5-cycloocadiene)tungsten ($C_{12}H_{12}O_4W$), or an amino-tungsten compound such as bis(tert-butylimino)bis(tert-butylamino)tungsten ($(C_4H_9NH)_2W(C_4H_9N)_2$), among other tungsten precursors.

Figure 3F:
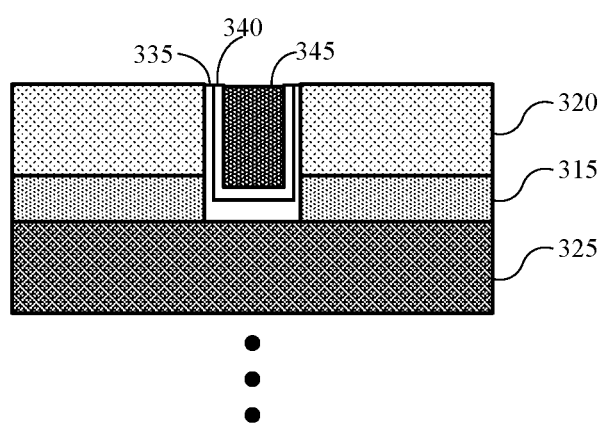

In some embodiments, method 200 may include a planarization operation 225 to planarize the metal-fill material 345 at the top of via 310 as shown in FIG. 3F. In embodiments, the planarization operation 225 may include the removal of the portion of the metal-fill material 345 above the top of via 310 by dry-etch, wet-etch, or chemical mechanical polishing, among other material removal techniques.

Figure 4:
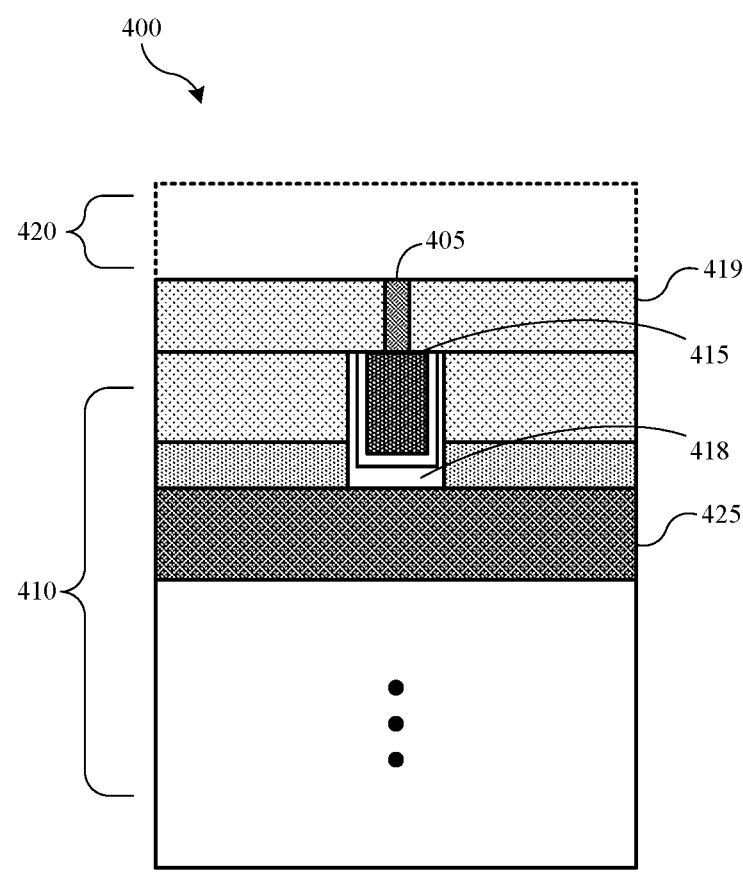
FIG. 4 shows a cross-sectional view of a substrate having at least two devices on a semiconductor substrate according to embodiments of the present technology.

Referring to FIG. 4, in some additional embodiments, method 200 may include operation 230 to form a contact 405 at a top surface of the metal-filled via 415 that is part of a first semiconductor device 410. The contact 405 may be made of an electrically conductive metal such tungsten, and may form an electrical connection between the metal-filled via 415 and a second semiconductor device 420. In embodiments, at least one separation layer 419 may surround the contact 405 and electrically insulate the first and second semiconductor devices at locations other than contacts like contact 405. In further embodiments, the separation layer 419 may be made from a dielectric material such as silicon oxide, silicon nitride, and/or silicon-oxy-carbide, among other dielectric materials.

In embodiments, the second semiconductor device 420 may be formed concurrently or after the formation of the final metal line 425 in the first semiconductor device 410. In these embodiments, the formation of the metal-filled via 415 may represent operations in the back-end-of-line (BEOL) fabrication of the first semiconductor device 410. In still further embodiments, final BEOL operations such as advanced packaging and the formation of solder bumps may be delayed until after the formation of the second semiconductor device 420. In yet further embodiments, the final BEOL operations may be delayed until all the devices have been formed on the semiconductor substrate. The barrier layer 418 between the metal line 425 and the metal-fill in the metal-filled via 415 may slow or prevent migration of metal from the metal line during high-temperature, FEOL operations used to form the initial layers of the second semiconductor device 420. By preventing this metal migration, the number of voids and contaminants from the metal line 425 in the metal-filled via 415 is significantly reduced. In further embodiments, the first semiconductor device 410 may be a logic device and the second semiconductor device 420 may be a memory device, both of which are integrated on a single semiconductor substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a ledge" includes a plurality of such ledges, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a via in a semiconductor structure, wherein the via comprises a bottom surface and sidewall surfaces formed in the semiconductor structure, wherein the bottom surface exposes a copper metal line;
   depositing a tantalum nitride layer on the copper metal line exposed on the bottom surface of the via, wherein the tantalum nitride layer is deposited at a temperature less than 100° C. while contacting the copper metal line;
   depositing a titanium nitride layer on the tantalum nitride layer, wherein the titanium nitride layer is deposited at a temperature greater than or about 400° C. while contacting the tantalum nitride layer; and
   depositing a metal on the titanium nitride layer, wherein the metal is deposited at a temperature greater than or about 300° C.

2. The semiconductor processing method of claim 1, wherein the tantalum nitride layer is deposited by physical vapor deposition.

3. The semiconductor processing method of claim 1, wherein the tantalum nitride layer has a greater thickness on the bottom surface of the via than the sidewall surfaces of the via.

4. The semiconductor processing method of claim 1, wherein the tantalum nitride layer has a thickness less than or about 60Å.

5. The semiconductor processing method of claim 1, wherein the titanium nitride layer is deposited by atomic layer deposition.

6. The semiconductor processing method of claim 1, wherein the titanium nitride layer has the same thickness on the bottom surface and the sidewall surfaces of the via.

7. The semiconductor processing method of claim 1, wherein the metal deposited on the titanium nitride layer comprises tungsten.

8. The semiconductor processing method of claim 1, wherein the metal deposited on the titanium nitride layer is deposited by chemical vapor deposition.

9. A semiconductor processing method comprising:
   forming a via on a metal line in a final metallization layer of a semiconductor structure;
   forming a tantalum nitride layer in the via, wherein the tantalum nitride layer is formed directly on the final metallization layer at a temperature less than 100° C. via physical vapor deposition while contacting the final metallization layer;
   forming a nucleation layer on the tantalum nitride layer in the via; and
   depositing a second metal on the nucleation layer in the via.

10. The semiconductor processing method of claim 9, wherein the metal line comprises copper.

11. The semiconductor processing method of claim 9, wherein the nucleation layer comprises titanium nitride deposited by atomic layer deposition.

12. The semiconductor processing method of claim 9, wherein the second metal comprises tungsten, molybdenum, cobalt, or ruthenium.

13. The semiconductor processing method of claim 9, wherein the second metal is deposited by chemical vapor deposition at a CVD deposition temperature greater than or about 300° C.

14. The semiconductor processing method of claim 9, wherein the via is formed through a first layer of dielectric material and a second layer of dielectric material, wherein the first layer of dielectric material comprises a silicon-oxygen-and-carbon-containing dielectric material having a thickness of greater than or about 500 Å, and the second layer of dielectric material has a thickness greater than or about 800 Å.

15. The semiconductor processing method of claim 9, wherein the tantalum nitride layer is formed in the via using an isotropic deposition process.

16. The semiconductor processing method of claim 9, wherein the barrier layer comprises a thickness of less than 50 Å and is characterized by a bottom surface to sidewall surface thickness ration that is greater than or about 1.5:1.

17. The semiconductor processing method of claim 9, wherein the nucleation layer has a thickness less than or about 50 Å and is a same thickness as the tantalum nitride layer.

18. The semiconductor processing method of claim 9, wherein the final metallization layer comprises a final back-end-of-line (BEOL) metallization layer of a logic device, and the method further comprises forming a first front-end-of-line (FEOL) metallization layer for a memory device over the logic device.

19. The semiconductor processing method of claim 9, wherein the nucleation layer is formed at a temperature greater than or about 400° C. while contacting the tantalum nitride layer.

20. The semiconductor processing method of claim 9, wherein the via has an aspect ratio of greater than or about 2:1 and comprises a cylindrical via shape that is tapered between a top and a bottom surface such that an area ratio between the top and the bottom surface of the via is greater than or 1.25:1.

* * * * *